US011906599B2

(12) United States Patent
Nakayama et al.

(10) Patent No.: US 11,906,599 B2
(45) Date of Patent: Feb. 20, 2024

(54) EARTH LEAKAGE DETECTING DEVICE, AND VEHICULAR POWER SUPPLY SYSTEM

(71) Applicant: SANYO Electric Co., Ltd., Osaka (JP)

(72) Inventors: Masato Nakayama, Hyogo (JP); Tomonori Kunimitsu, Hyogo (JP); Taisuke Hamada, Hyogo (JP); Jun Asakura, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 232 days.

(21) Appl. No.: 17/621,185

(22) PCT Filed: Jun. 15, 2020

(86) PCT No.: PCT/JP2020/023447
§ 371 (c)(1),
(2) Date: Dec. 20, 2021

(87) PCT Pub. No.: WO2020/262083
PCT Pub. Date: Dec. 30, 2020

(65) Prior Publication Data
US 2022/0357409 A1  Nov. 10, 2022

(30) Foreign Application Priority Data
Jun. 28, 2019 (JP) ................. 2019-121504

(51) Int. Cl.
G01R 31/52 (2020.01)
G01R 31/00 (2006.01)
(Continued)

(52) U.S. Cl.
CPC ............ G01R 31/52 (2020.01); B60L 3/0046 (2013.01); B60L 3/0069 (2013.01); B60L 3/12 (2013.01); G01R 31/006 (2013.01); H02H 3/17 (2013.01)

(58) Field of Classification Search
CPC .... G01R 31/00; G01R 31/005; G01R 31/006; G01R 31/52; B60L 3/00; B60L 3/0023;
(Continued)

(56) References Cited

U.S. PATENT DOCUMENTS 4,027,203 A * 5/1977 Moran ................. H02H 3/105
361/96
10,663,510 B2 * 5/2020 Anuchin ................ G01R 31/52
(Continued)

FOREIGN PATENT DOCUMENTS

JP  2003-250201      9/2003
JP  2004-104923 A    4/2004
JP  2020134295 A *   8/2020  ............. G01R 31/50

OTHER PUBLICATIONS

The Extended European Search Report dated Jul. 11, 2022 for the related European Patent Application No. EP20832357.6.
(Continued)

Primary Examiner — Hoai-An D. Nguyen
(74) Attorney, Agent, or Firm — WHDA, LLP

(57) ABSTRACT

An earth leakage detecting device comprises following elements. A first end of coupling capacitor is connected to a current path of power storage connected to load in a state of being insulated from a ground. Voltage output unit generates a periodic voltage that changes periodically, and applies the periodic voltage to a second end of coupling capacitor via impedance element. Voltage measurer measures a voltage at a connection point between coupling capacitor and impedance element. Earth leakage determiner determines presence or absence of an earth leakage between the current path of power storage and the ground on the basis of the measured voltage. Voltage output unit has a preparation period for constantly outputting a potential between a high-side poten-
(Continued)

tial and a low-side potential of the periodic voltage before a measurement period for outputting the periodic voltage.

7 Claims, 11 Drawing Sheets

(51) Int. Cl.
  *B60L 3/00* (2019.01)
  *B60L 3/12* (2006.01)
  *H02H 3/17* (2006.01)
(58) Field of Classification Search
  CPC ........ B60L 3/0046; B60L 3/0069; B60L 3/12;
   H02H 3/00; H02H 3/16; H02H 3/17
  USPC ................................................. 324/500, 509
  See application file for complete search history.

(56) References Cited

U.S. PATENT DOCUMENTS

| | | | |
|---|---|---|---|
| 11,385,297 B2* | 7/2022 | Wakimoto | ............. G01R 31/42 |
| 2012/0206152 A1 | 8/2012 | Naruse et al. | |
| 2018/0038904 A1 | 2/2018 | Horiguchi | |
| 2022/0011377 A1* | 1/2022 | Nakayama | ................ H02H 3/17 |
| 2022/0120823 A1* | 4/2022 | Nakayama | ................ H02H 3/17 |
| 2022/0357408 A1* | 11/2022 | Nakayama | ............ B60L 3/0046 |

OTHER PUBLICATIONS

International Search Report of PCT application No. PCT/JP2020/023447 dated Sep. 1, 2020.

* cited by examiner

FIG. 3
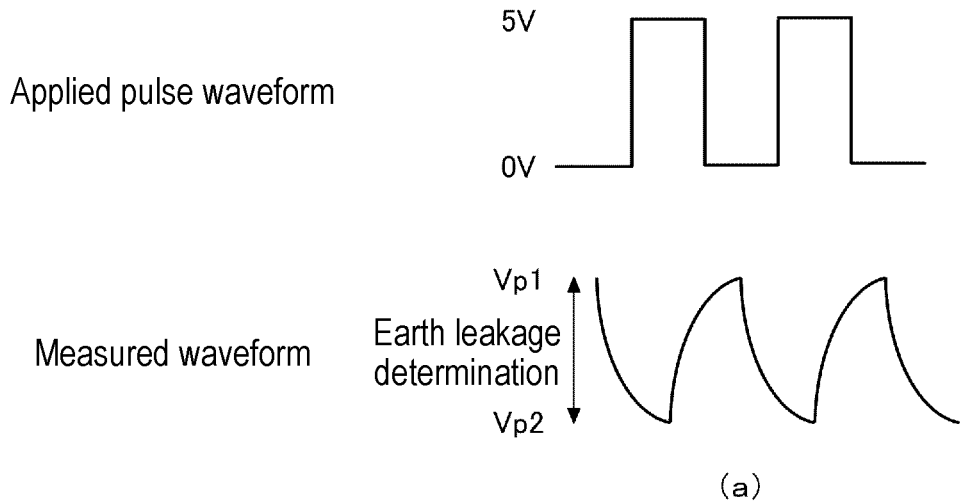
(a)
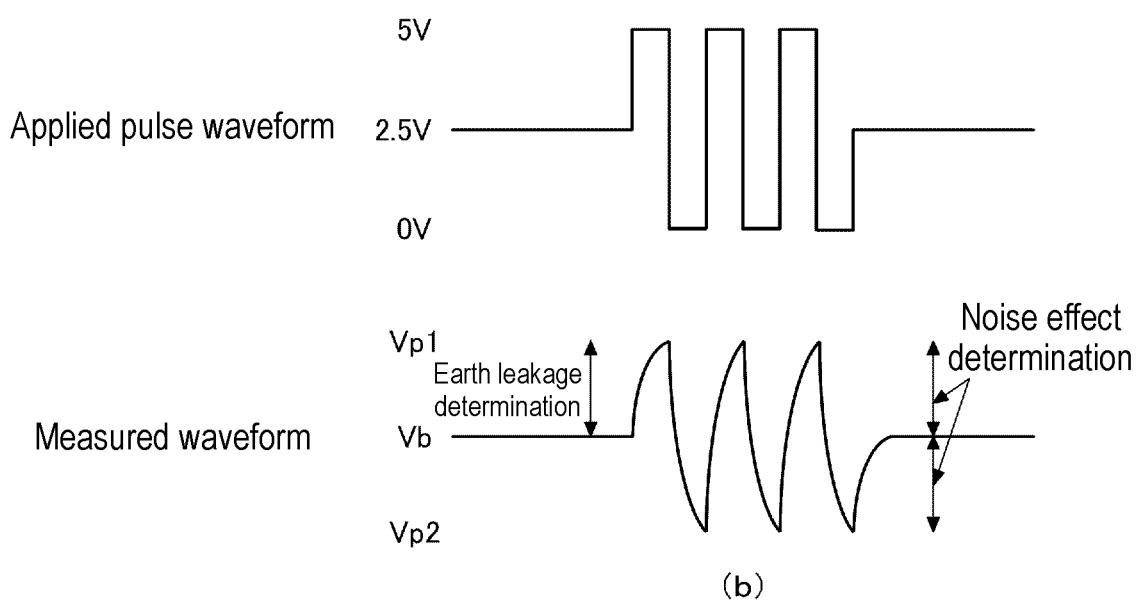
(b)

FIG. 5
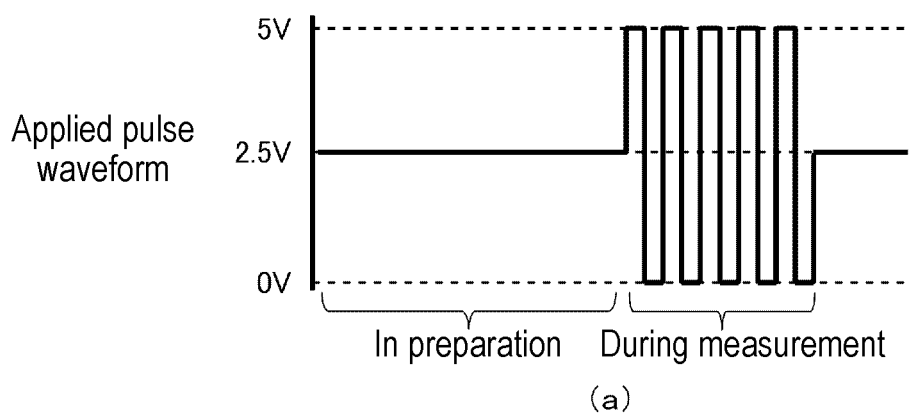
(a)
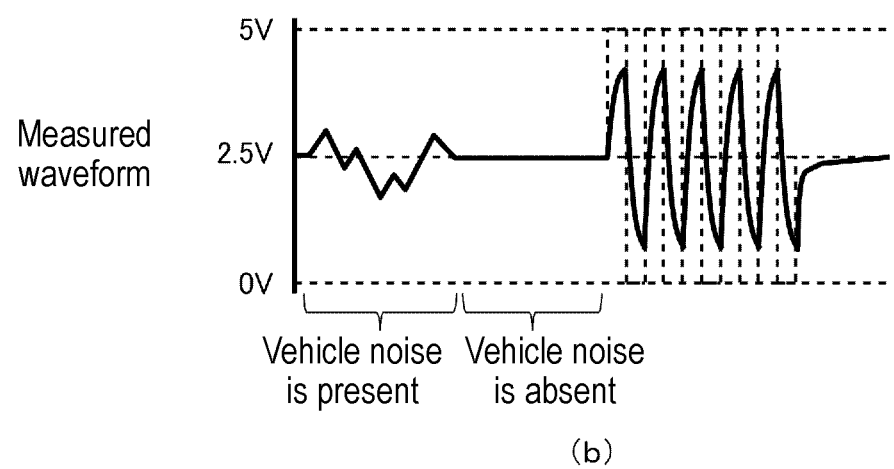
(b)

EARTH LEAKAGE DETECTING DEVICE, AND VEHICULAR POWER SUPPLY SYSTEM

TECHNICAL FIELD

The present invention relates to an earth leakage detecting device that detects an earth leakage of a load insulated from a ground, and a vehicular power supply system.

BACKGROUND ART

In recent years, hybrid vehicles (HV), plug-in hybrid vehicles (PHV), and electric vehicles (EV) have become widespread. In these electric powered vehicles, a high-voltage driving battery (traction battery) is mounted in addition to an auxiliary battery (generally, a lead battery having an output of 12 V). In order to prevent an electric shock, a high-voltage circuit including a high-voltage driving battery, an inverter, and a drive motor is insulated from a body (chassis ground) of a vehicle.

A Y capacitor is inserted between a positive wire of the high-voltage circuit on a vehicle side and the chassis ground, and a Y capacitor is inserted between a negative wire of the high-voltage circuit on the vehicle side and the chassis ground. Accordingly, power source is stably supplied from the high-voltage driving battery to a load on the vehicle side. An earth leakage detecting device that detects an earth leakage by monitoring an insulation resistance between the high-voltage circuit and the chassis ground is mounted on the vehicle.

In an AC type earth leakage detecting device, presence or absence of an earth leakage is detected by applying a pulse voltage to a positive-electrode terminal or a negative-electrode terminal of the driving battery via a resistor and a coupling capacitor, and measuring a voltage at a connection point (measurement point) between the resistor and the coupling capacitor (see, for example, PTL 1).

CITATION LIST

Patent Literature

PTL 1: Unexamined Japanese Patent Publication No. 2003-250201

SUMMARY OF THE INVENTION

In the above configuration of the AC type earth leakage detecting device, when a total voltage of the driving battery fluctuates, a fluctuation amount is superimposed on a measured pulse voltage, which makes it difficult to accurately determine the presence or absence of an earth leakage. In order to remove an influence of a load variation on the vehicle side, measures such as insertion of a high-pass filter and a band-pass filter can be considered, but these measures would complicate a circuit configuration.

The present disclosure has been made in view of such circumstances, and an object of the present disclosure is to provide a technique for detecting an earth leakage with high accuracy with a simple configuration.

In order to solve the above problem, an earth leakage detecting device according to an aspect of the present disclosure includes a coupling capacitor including a first end that is connected to a current path of a power storage connected to a load in a state of being insulated from a ground, a voltage output unit that generates a periodic voltage that changes periodically, the voltage output unit applying the periodic voltage to a second end of the coupling capacitor via an impedance element, a voltage measurer that measures a voltage at a connection point between the coupling capacitor and the impedance element, and an earth leakage determiner that determines presence or absence of an earth leakage between the current path of the power storage and the ground based on the voltage measured by the voltage measurer. The voltage output unit has a preparation period for constantly outputting a potential between a high-side potential and a low-side potential of the periodic voltage before a measurement period for outputting the periodic voltage. The earth leakage determiner sets a voltage measured in the preparation period to a reference potential, and the earth leakage determiner uses, for earth leakage determination in the current path of the power storage, at least one of a first peak value indicated by a difference between an upper peak value of a voltage waveform measured in the measurement period and the reference potential or a second peak value indicated by a difference between the reference potential and a lower peak value of the voltage waveform measured in the measurement period.

The present disclosure can achieve the earth leakage detection with high detection accuracy with a simple configuration.

BRIEF DESCRIPTION OF DRAWINGS

FIGS. 3(a) and 3(b) is diagram illustrating examples of an applied pulse waveform and a measured voltage waveform in the comparative example and the first exemplary embodiment.

FIG. 5 is a diagram for describing a specific example of preliminary noise determination processing in the first exemplary embodiment.

FIGS. 9(a) and 9(b) is diagram illustrating an example of a measured voltage waveform when a main relay is turned on.

DESCRIPTION OF EMBODIMENTS

Comparative Example

Figure 1:
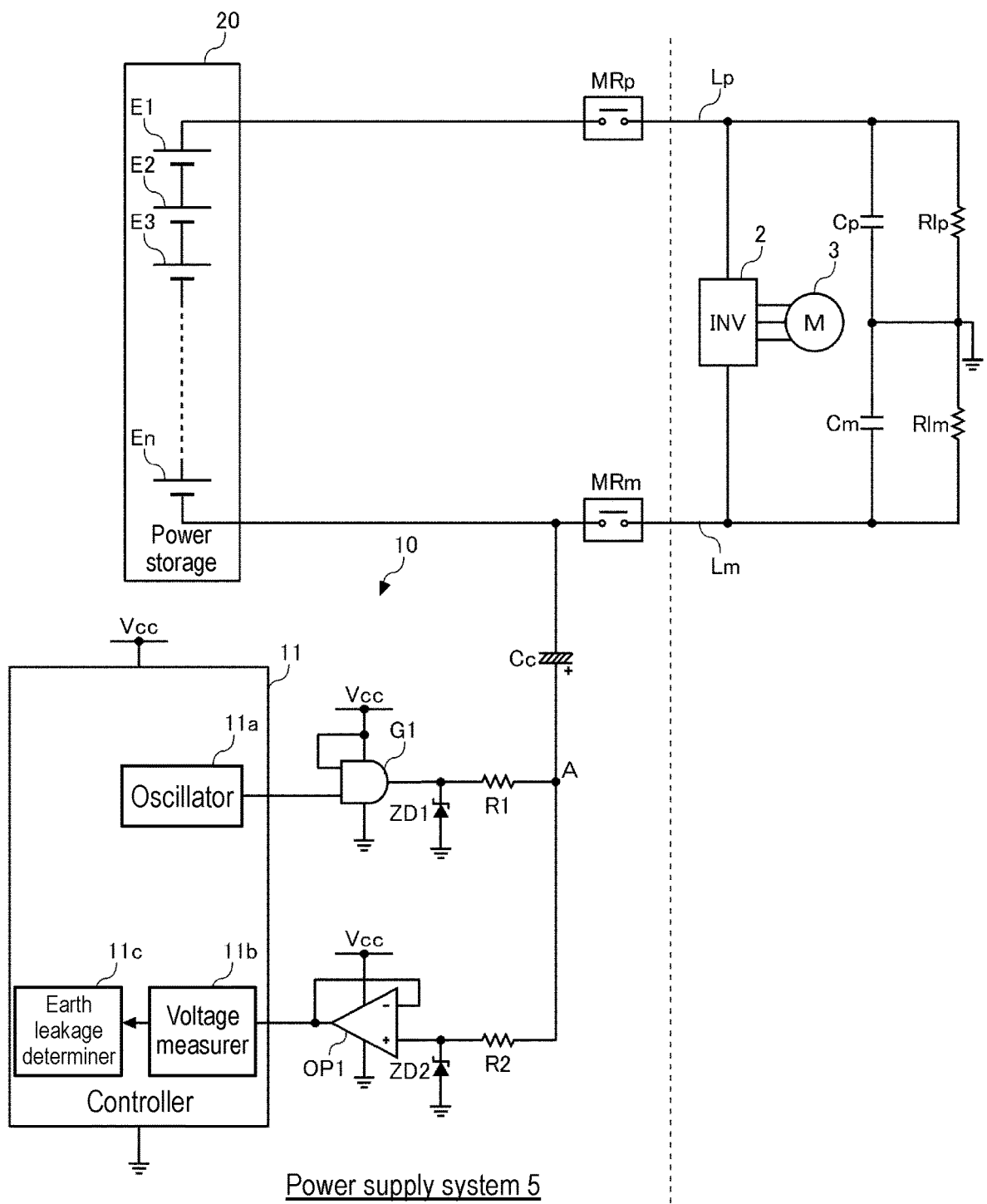
FIG. 1 is a diagram for describing a configuration of a power supply system including an earth leakage detecting device according to a comparative example.

FIG. 1 is a diagram for describing a configuration of power supply system 5 including earth leakage detecting device 10 according to a comparative example. Power supply system 5 is mounted on an electric powered vehicle. Power supply system 5 is provided separately from an auxiliary battery (generally, a lead battery having an output of 12 V being used) in the electric powered vehicle. Power supply system 5 includes high-voltage power storage 20 and earth leakage detecting device 10. Power storage 20 includes a plurality of cells E1 to En connected in series. As the cells, a lithium ion battery cell, a nickel metal hydride battery cell, a lead battery cell, an electric double layer capacitor cell, a lithium ion capacitor cell, or the like can be used. Hereinafter, an example using lithium ion battery cells (nominal voltage: from 3.6 V to 3.7 V, inclusive) is assumed in this description.

The electric powered vehicle includes inverter 2 and motor 3 as high-voltage loads. A positive electrode of power storage 20 and one end of inverter 2 are connected to each other by positive wire Lp, and a negative electrode of power storage 20 and the other end of inverter 2 are connected to each other by negative wire Lm. Positive-side main relay MRp is inserted into positive wire Lp, and negative-side main relay MRm is inserted into negative wire Lm. Positive-side main relay MRp and negative-side main relay MRm function as contactors that control conduction and disconnection between power storage 20 and the high-voltage loads in the electric powered vehicle. In place of these relays, semiconductor switches having a high withstand voltage and high insulation can be used.

Inverter 2 is a bidirectional inverter that is connected between power storage 20 and motor 3. At the time of power running, inverter 2 converts DC power supplied from power storage 20 into AC power and supplies the AC power to motor 3. At the time of regeneration, inverter 2 converts AC power supplied from motor 3 into DC power and supplies the DC power to power storage 20. For example, a three-phase AC motor is used as motor 3. Motor 3 rotates in accordance with AC power supplied from inverter 2 at the time of power running. At the time of regeneration, rotational energy generated by deceleration is converted into AC power and the AC power is supplied to inverter 2.

Power storage 20 is mounted on the electric powered vehicle in a state where power storage 20 is insulated from a chassis ground of the electric powered vehicle. The auxiliary battery is mounted on the electric powered vehicle in a state where a negative electrode is electrically conductive with the chassis ground. Positive wire Lp closer to inverter 2 than positive-side main relay MRp and the chassis ground are connected to each other via positive-side Y capacitor Cp. Negative wire Lm closer to inverter 2 than negative-side main relay MRm and the chassis ground are connected to each other via negative-side Y capacitor Cm. Positive-side Y capacitor Cp has a function of galvanically insulating positive wire Lp and the chassis ground from each other and a function of stabilizing a voltage of positive wire Lp. Negative-side Y capacitor Cm has a function of galvanically insulating negative wire Lm and the chassis ground from each other and a function of stabilizing a voltage of negative wire Lm.

When power storage 20 is ideally insulated from the chassis ground, an intermediate potential of power storage 20 is maintained around a potential of the chassis ground. For example, when a voltage across terminals of power storage 20 is 250 V, a positive electrode potential of power storage 20 is maintained around +125 V, and a negative electrode potential is maintained around −125 V. When a human touches an exposed conducting part of the electric powered vehicle in a state where high-voltage power storage 20 and the chassis ground are electrically conductive with each other, there is a risk that the human receives an electric shock. In view of the above, in the electric powered vehicle on which high-voltage power storage 20 is mounted, it is necessary to mount earth leakage detecting device 10 on the electric powered vehicle so as to monitor an insulation state between a current path of power storage 20 connected to a high-voltage vehicle load and the chassis ground. In FIG. 1, an insulation state between positive wire Lp and the chassis ground is represented as positive-side earth leakage resistance Rlp, and an insulation state between negative wire Lm and the chassis ground is represented as negative-side earth leakage resistance Rlm.

In the comparative example, earth leakage detecting device 10 includes coupling capacitor Cc, first resistor R1, AND gate G1, first zener diode ZD1, second resistor R2, first operational amplifier OP1, second zener diode ZD2, and controller 11. Controller 11 includes oscillator 11a, voltage measurer 11b, and earth leakage determiner 11c. Controller 11 may include, for example, a microcomputer and a non-volatile memory (for example, an electrically erasable programmable read-only memory (EEPROM) or a flash memory).

A first end of coupling capacitor Cc is connected to the current path of power storage 20. In the example illustrated in FIG. 1, the first end of coupling capacitor Cc is connected to the negative electrode of power storage 20. The first end of coupling capacitor Cc may be connected to the positive electrode of power storage 20, or may be connected to a node of any of the plurality of cells E1 to En in power storage 20. A second end of coupling capacitor Cc is connected to an output terminal of a voltage output unit via first resistor R1. A connection point between the second end of coupling capacitor Cc and first resistor R1 is measurement point A. In place of first resistor R1, another impedance element may be used.

In FIG. 1, as coupling capacitor Cc, an aluminum electrolytic capacitor capable of increasing a capacity at a relatively low cost is used. The aluminum electrolytic capacitor has polarity. In FIG. 1, a positive electrode of the aluminum electrolytic capacitor is connected to measurement point A, and a negative electrode of the aluminum electrolytic capacitor is connected to the negative electrode of power storage 20. Coupling capacitor Cc may be configured by connecting a plurality of aluminum electrolytic capacitors in series. In this case, when a short-circuit failure occurs in one capacitor, galvanic insulation can be maintained by the remaining capacitors.

The voltage output unit generates a periodically changing periodic voltage, and applies the generated periodic voltage to the second end of coupling capacitor Cc via first resistor R1. Hereinafter, an example in which a rectangular wave voltage is used as the periodic voltage is assumed.

In the comparative example, the voltage output unit includes oscillator 11a and AND gate G1. Oscillator 11a includes a multivibrator and a local oscillator, and generates a rectangular wave having a preset frequency. The rectangular wave voltage generated by oscillator 11a is input to a first input terminal of AND gate G1. A second input terminal of AND gate G1 is connected to power source potential Vcc. AND gate G1 outputs a high level (power source potential Vcc) when the rectangular wave voltage input to the first input terminal is at a high level, and outputs a low level (ground electric potential) when the rectangular wave voltage input to the first input terminal is at a low level. The ground electric potential is connected to the chassis ground.

Hereinafter, an example in which power source potential Vcc is 5 V and the ground electric potential is 0 V will be assumed.

AND gate G1 functions as a buffer that separates controller 11 and measurement point A. AND gate G1 is an example of a buffer. For example, an OR gate or a voltage follower may be used instead of the AND gate. When an OR gate is used, the ground electric potential is connected to a second input terminal of the OR gate.

First zener diode ZD1 is connected between the chassis ground and a connection point between an output terminal of AND gate G1 and first resistor R1.

Measurement point A is connected to a non-inverting input terminal of first operational amplifier OP1 via second resistor R2. The inverting input terminal and an output terminal of the first operational amplifier OP1 are connected to each other. First operational amplifier OP1 functions as a voltage follower that performs only impedance conversion with an amplification factor of one time. First operational amplifier OP1 outputs a voltage at measurement point A to voltage measurer 11b. Second zener diode ZD2 is connected between the chassis ground and a connection point between the non-inverting input terminal of first operational amplifier OP1 and second resistor R2.

First zener diode ZD1 or second zener diode ZD2 prevents an overvoltage from being applied to AND gate G1 or first operational amplifier OP11 due to opening or closing of main relays MRp, MRm or the fluctuation of a load of power supply system 5.

Voltage measurer 11b measures a voltage at measurement point A. Voltage measurer 11b includes an A/D converter, and the A/D converter samples an analog voltage at measurement point A at a timing synchronized with a timing of a rising edge and a falling edge of the rectangular wave voltage generated by oscillator 11a, and converts the sampled analog voltage into a digital value. The voltage sampled at the timing of the rising edge of the rectangular wave voltage corresponds to a lower peak value of a measured voltage waveform, and the voltage sampled at the timing of the falling edge of the rectangular wave voltage corresponds to an upper peak value of the measured voltage waveform. In consideration of blunting of the rectangular wave voltage, the timing at which the lower peak value is to be sampled and the timing at which the upper peak value is to be sampled may be adjusted. The A/D converter outputs a digital value obtained by converting the analog voltage at measurement point A to earth leakage determiner 11c.

Earth leakage determiner 11c determines presence or absence of an earth leakage between the current path of power storage 20 and the chassis ground on the basis of the voltage at measurement point A measured by voltage measurer 11b. When a peak-to-peak value indicated by a difference between the upper peak value and the lower peak value is smaller than a set value, earth leakage determiner 11c determines that an earth leakage has occurred between the current path of power storage 20 and the chassis ground. The set value is determined on the basis of the peak-to-peak value of the measured voltage waveform at a time of occurrence of the earth leakage derived in advance by an experiment or simulation carried out by a designer. When the earth leakage occurs between the current path of power storage 20 and the chassis ground, an AC current flows from AND gate G1 to coupling capacitor Cc via first resistor R1 acting as a detection resistance. When the current flows through first resistor R1, a voltage amplitude at measurement point A decreases due to a voltage drop.

First Exemplary Embodiment

Figure 2:
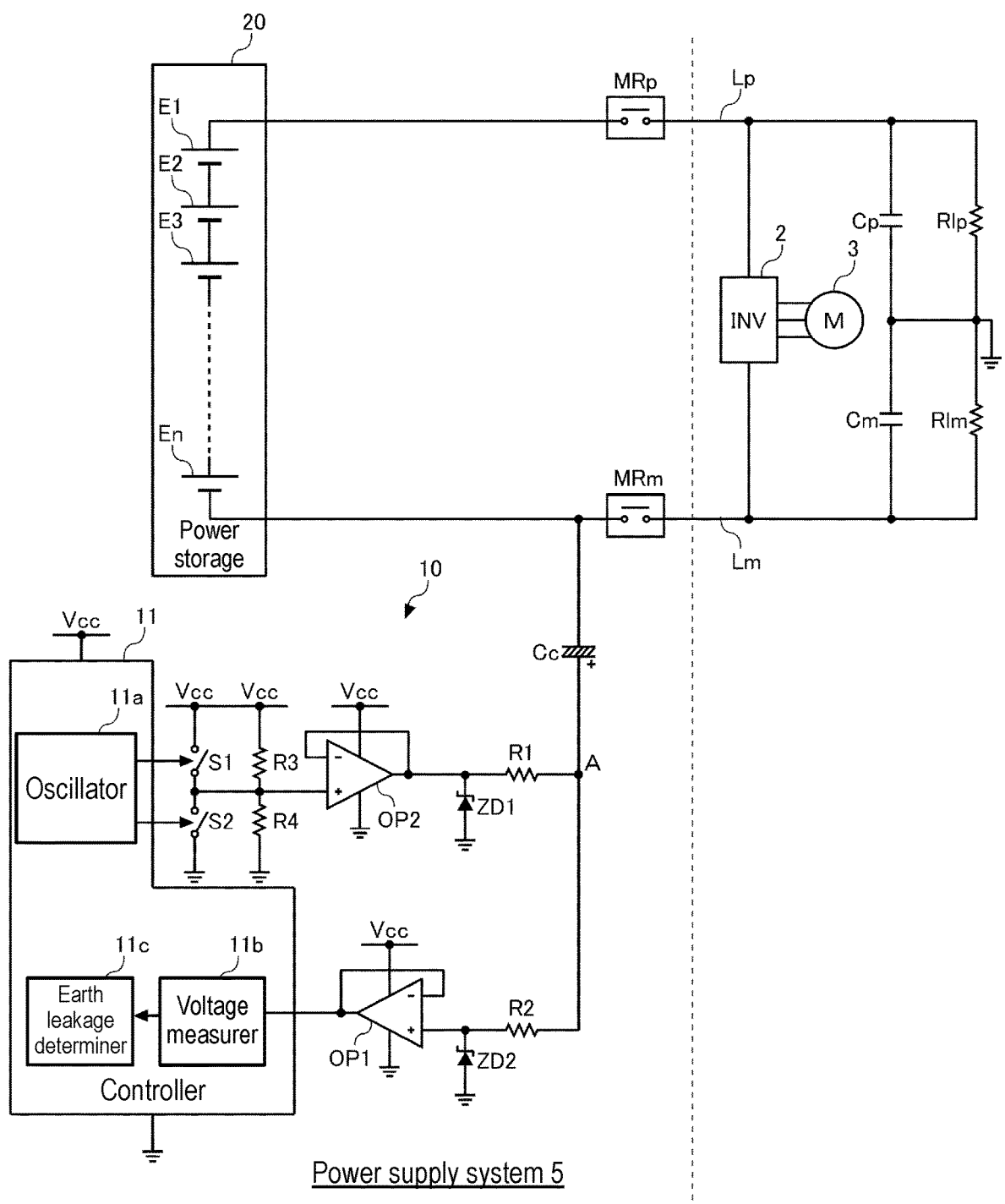
FIG. 2 is a diagram for describing a configuration of a power supply system including an earth leakage detecting device according to a first exemplary embodiment.

FIG. 2 is a diagram for describing a configuration of power supply system 5 including earth leakage detecting device 10 according to a first exemplary embodiment. Hereinafter, differences from the configuration of power supply system 5 according to the comparative example illustrated in FIG. 1 will be described. In the comparative example, the voltage output unit includes oscillator 11a and AND gate G1, but in the first exemplary embodiment, the voltage output unit includes oscillator 11a, second operational amplifier OP2, third resistor R3, fourth resistor R4, first switch S1, and second switch S2.

Third resistor R3 and fourth resistor R4 are connected in series between power source potential Vcc and the ground electric potential. A voltage dividing point between third resistor R3 and fourth resistor R4 is connected to a non-inverting input terminal of second operational amplifier OP2. First switch S1 and second switch S2 are connected in series between power source potential Vcc and the ground electric potential. A connection point between first switch S1 and second switch S2 is connected to a voltage dividing point between third resistor R3 and fourth resistor R4. A semiconductor switch can be used as first switch S1 and second switch S2. For example, a P-channel metal oxide semiconductor field effect transistor (MOSFET) may be used as first switch S1, and an N-channel MOSFET may be used as second switch S2.

Third resistor R3 and fourth resistor R4 having the same value are used. Therefore, in a state where both first switch S1 and second switch S2 are turned off, an intermediate potential between power source potential Vcc and the ground electric potential (2.5 V in the present exemplary embodiment) is input to the non-inverting input terminal of second operational amplifier OP2. In a state where first switch S1 is turned on and second switch S2 is turned off, power source potential Vcc (5 V in the present exemplary embodiment) is input to the non-inverting input terminal of second operational amplifier OP2. In a state where first switch S1 is turned off and second switch S2 is turned on, the ground electric potential (0 V in the present exemplary embodiment) is input to the non-inverting input terminal of second operational amplifier OP2.

An inverting input terminal and an output terminal of second operational amplifier OP2 are connected to each other. Second operational amplifier OP2 functions as a voltage follower that performs only impedance conversion with an amplification factor of one time. Oscillator 11a can arbitrarily apply power source potential Vcc, intermediate potential Vcc/2, and the ground electric potential from second operational amplifier OP2 to measurement point A via first resistor R1 by outputting a control signal for controlling turning on and off of each of first switch S1 and second switch S2.

Similarly to the comparative example, the voltage output unit can generate a rectangular wave voltage with power source potential Vcc as a high-side potential and the ground electric potential as a low-side potential, and apply the generated rectangular wave voltage to measurement point A. Hereinafter, a period during which the rectangular wave voltage is applied to measurement point A is referred to as a measurement period. In the first exemplary embodiment, the voltage output unit has a preparation period for constantly outputting the intermediate potential of the rectangular wave voltage before the measurement period.

Earth leakage determiner 11c sets a constant voltage measured by voltage measurer 11b in the preparation period to a reference potential. Earth leakage determiner 11c calculates a first peak value between the upper peak value of the voltage waveform measured by voltage measurer 11b and the reference potential in the measurement period, and calculates a second peak value between the reference potential and the lower peak value of the measured voltage waveform. When the first peak value is smaller than a set value, earth leakage determiner 11c determines that an earth leakage has occurred between the current path of power storage 20 and the chassis ground. When the calculated second peak value is smaller than a set value, earth leakage determiner 11c may determine that an earth leakage has occurred between the current path of power storage 20 and the chassis ground. The set value is determined on the basis of the first peak value or the second peak value of the measured voltage waveform at a time of occurrence of the earth leakage derived in advance by an experiment or simulation by the designer.

FIGS. 3(a) and 3(b) is diagram illustrating examples of an applied pulse waveform and a measured voltage waveform in the comparative example and the first exemplary embodiment. FIG. 3(a) illustrates examples of a pulse waveform applied from the voltage output unit to measurement point A and a voltage waveform at measurement point A measured by voltage measurer 11b in the comparative example. In the pulse waveform, the high-side potential is set to 5 V, and the low-side potential is set to 0 V. Although not illustrated in FIG. 3(a), the output of the voltage output unit is 0 V in a period in which a pulse voltage is not output from the voltage output unit. Earth leakage determiner 11c determines the presence or absence of an earth leakage on the basis of a peak-to-peak value defined by a difference between upper peak value Vp1 and lower peak value Vp2 of a voltage waveform measured in a period in which a pulse voltage is applied to measurement point A.

FIG. 3(b) illustrates examples of a pulse waveform applied from the voltage output unit to measurement point A and a voltage waveform at measurement point A measured by voltage measurer 11b in the first exemplary embodiment. In the first exemplary embodiment as well, in the pulse waveform, the high-side potential is set to 5 V, and the low-side potential is set to 0 V. In the first exemplary embodiment, the intermediate potential (2.5 V) is output from the voltage output unit while the pulse voltage is not output from the voltage output unit. Earth leakage determiner 11c sets the voltage measured in the period in which the intermediate potential is applied to measurement point A, to reference potential Vb. Voltage measurer 11b specifies upper peak value Vp1 of the voltage waveform measured in the period in which the pulse voltage is applied to measurement point A, and determines the presence or absence of an earth leakage on the basis of the first peak value defined by a difference between upper peak value Vp1 and reference potential Vb. Earth leakage determiner 11c may specify lower peak value Vp2 of the voltage waveform measured in the period in which the pulse voltage is applied to measurement point A, and determine the presence or absence of the earth leakage on the basis of the second peak value defined by the difference between reference potential Vb and lower peak Vp2.

In the first exemplary embodiment, earth leakage determiner 11c can evaluate reliability of earth leakage determination by comparing the first peak value and the second peak value calculated by specifying upper peak value Vp1 and lower peak Vp2 of the measured voltage waveform. Earth leakage determiner 11c validates the earth leakage determination when the first peak value and the second peak value correspond to each other, and invalidates the earth leakage determination when the first peak value and the second peak value do not correspond to each other. When the voltage at measurement point A is an ideal voltage that is not affected by noise, the first peak value and the second peak value have symmetry, and absolute values of the first peak value and the second peak value are to be substantially equal to each other. Conversely, when the values of the first peak value and the second peak value do not substantially coincide with each other, it can be said that the voltage at measurement point A is greatly affected by noise. It can be said that the earth leakage determination based on the voltage at measurement point A greatly affected by the noise has low reliability. Therefore, results of the earth leakage determination executed in such a state of low reliability is treated as invalid. Alternatively, in a state where the reliability is low, the earth leakage determination itself is stopped.

Figure 4:
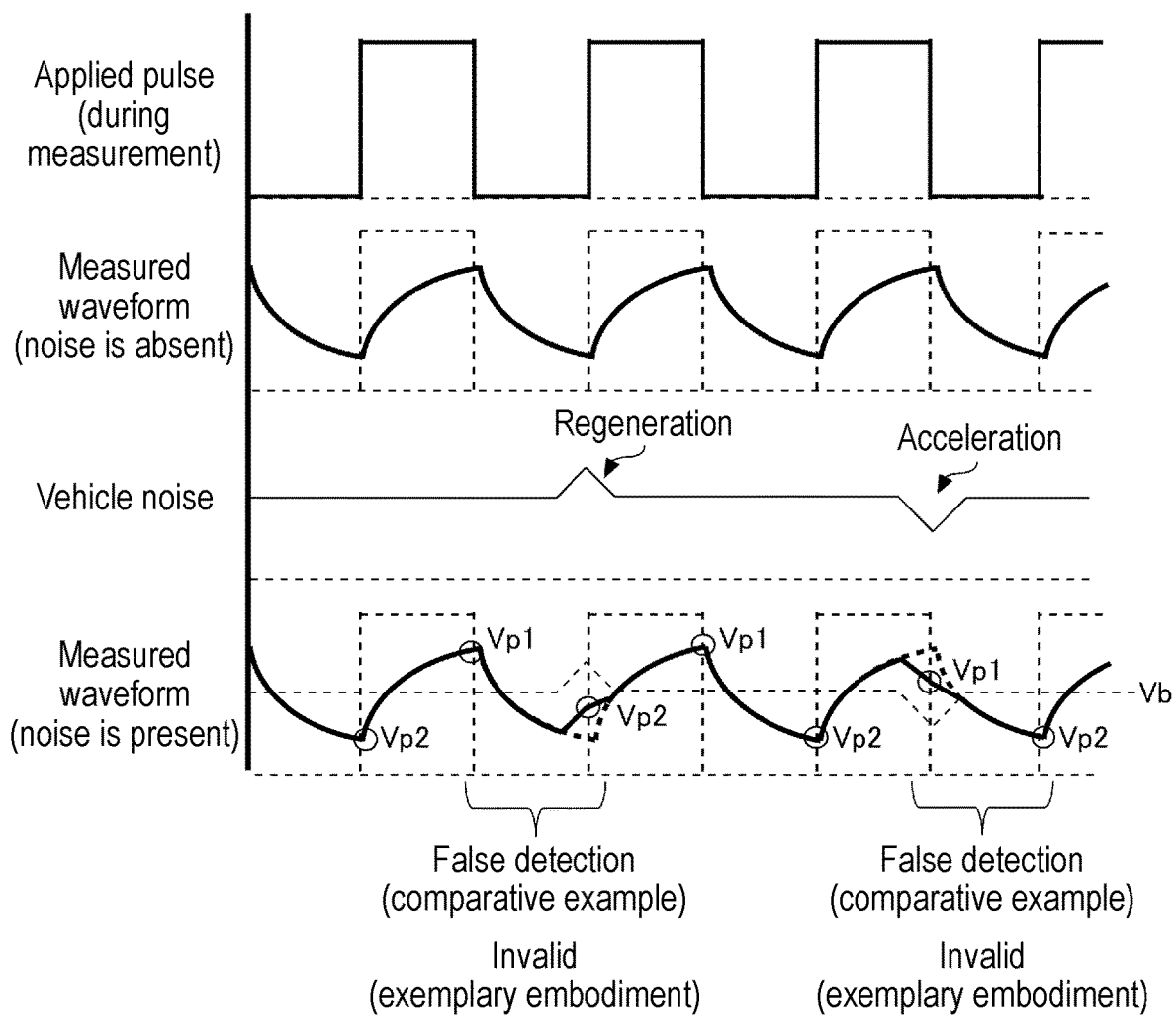
FIG. 4 is a diagram for describing a specific example of reliability evaluation of earth leakage determination using a first peak value and a second peak value in the first exemplary embodiment.

FIG. 4 is a diagram for describing a specific example of reliability evaluation of the earth leakage determination using the first peak value and the second peak value in the first exemplary embodiment. When motor 3 in the electric powered vehicle starts regenerative power generation, the voltage of power storage 20 instantaneously increases by electric power generated by motor 3. When the electric powered vehicle accelerates, a rotation speed of motor 3 increases, and the voltage of power storage 20 instantaneously decreases due to the increase in power supplied to motor 3. Such instantaneous voltage fluctuation of power storage 20 passes through coupling capacitor Cc as vehicle noise and is superimposed on the voltage at measurement point A.

As illustrated in FIG. 4, when regenerative power generation by motor 3 occurs at a timing at which lower peak value Vp2 is to be sampled, lower peak value Vp2 is detected as a value higher than an original value due to the influence of noise. In this case, the peak-to-peak value becomes smaller than the original value, and in the earth leakage determination shown in the comparative example, there is a possibility that it is erroneously determined that an earth leakage has occurred although the earth leakage has not occurred.

Similarly, when acceleration by motor 3 occurs at a timing at which upper peak value Vp1 is to be sampled, upper peak value Vp1 is detected as a value lower than an original value due to the influence of noise. In this case, the peak-to-peak value becomes smaller than the original value, and in the earth leakage determination shown in the comparative example, there is a possibility that it is erroneously determined that an earth leakage has occurred although the earth leakage has not occurred.

On the other hand, in the first exemplary embodiment, the symmetry between the first peak value and the second peak value is broken in both cases where the regenerative power generation by motor 3 occurs at the timing at which lower peak value Vp2 is to be sampled and where the acceleration by motor 3 occurs at the timing at which upper peak value Vp1 is to be sampled, and thus the earth leakage determination becomes invalid. Therefore, erroneous determination can be avoided.

As described above, in the first exemplary embodiment, the earth leakage determination is invalidated when the first peak value and the second peak value based on reference potential Vb do not correspond to each other, and thus the detection accuracy of an earth leakage can be enhanced without providing a large filter or the like for noise removal.

In the first exemplary embodiment, when voltage measurer 11b does not measure the constant potential for a predetermined time or more in the preparation period, the voltage output unit suspends a transition to the measurement period. The voltage output unit outputs a fixed intermediate potential in the preparation period. Therefore, when no noise is superimposed on measurement point A, voltage measurer 11b is to observe a constant potential as the voltage at measurement point A. Conversely, when no constant potential is observed, it can be said that the voltage at measurement point A is greatly affected by noise. It can be said that the earth leakage determination based on the voltage at measurement point A greatly affected by the noise has low reliability. Therefore, the earth leakage determination is suspended until the noise ceases.

FIG. 5 is a diagram for describing a specific example of preliminary noise determination processing in the first exemplary embodiment. When the voltage measured by voltage measurer 11b is not stable in the preparation period, earth leakage determiner 11c determines that vehicle noise is superimposed. Earth leakage determiner 11c notifies a determination result to the voltage output unit. When the determination result indicates that noise is present, the voltage output unit suspends the transition to the measurement period and continues the output of the intermediate potential.

Earth leakage determiner 11c determines that there is no noise when the voltage measured by voltage measurer 11b does not substantially fluctuate for a certain period (for example, 0.5 s to 1.0 s) in the preparation period. Earth leakage determiner 11c notifies the determination result to the voltage output unit, and sets the measured voltage to reference potential Vb. When the determination result shows that there is no noise, the voltage output unit transitions to the measurement period.

Figure 6:
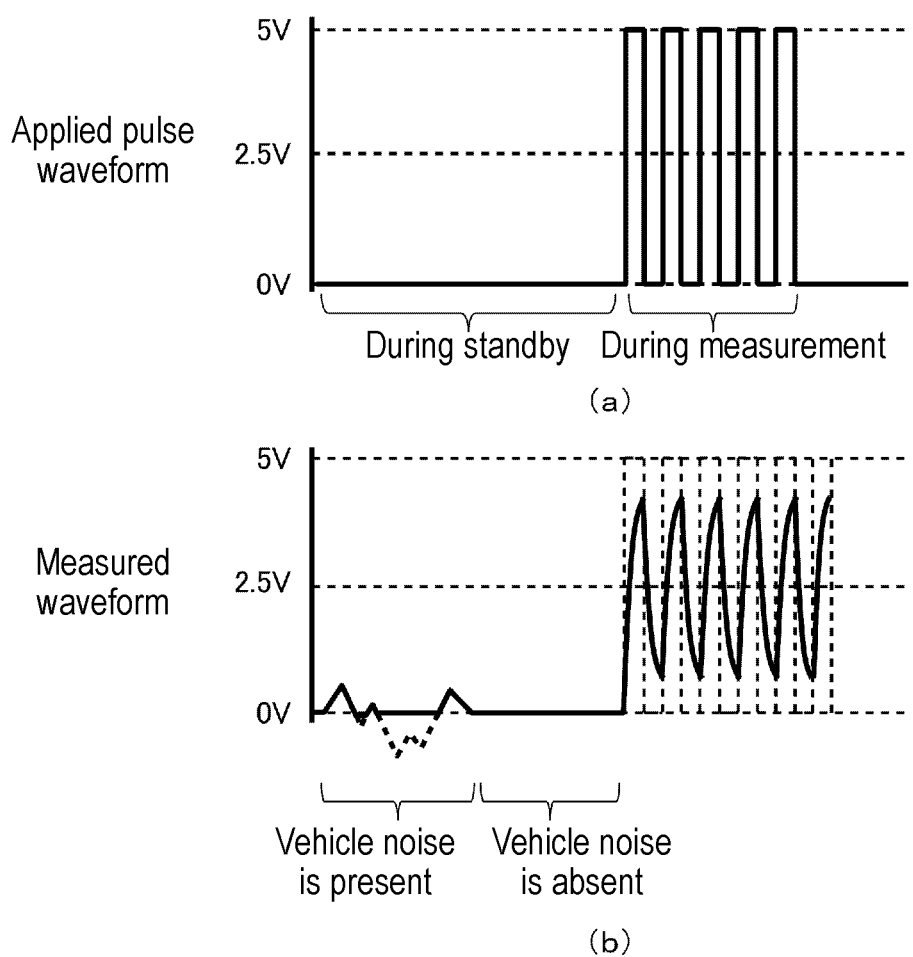
FIG. 6 is a diagram for describing a specific example of preliminary noise determination processing in the comparative example.

FIG. 6 is a diagram for describing a specific example of preliminary noise determination processing in the comparative example. In the comparative example, the voltage output unit always outputs 0 V during a standby period. Therefore, the voltage fluctuation on a negative side due to noise cannot be detected, and the presence or absence of noise cannot be determined accurately in advance. For example, when the noise is generated only on the negative side, it is erroneously determined that there is no noise, and the processing proceeds to the earth leakage determination.

As described above, in the first exemplary embodiment, by applying the intermediate potential to measurement point A in the preparation period, a state of noise at measurement point A can be accurately recognized in advance. Therefore, the earth leakage detection can be started after confirming that there is substantially no influence of noise, and the accuracy detection of an earth leakage can be enhanced.

Figure 7:
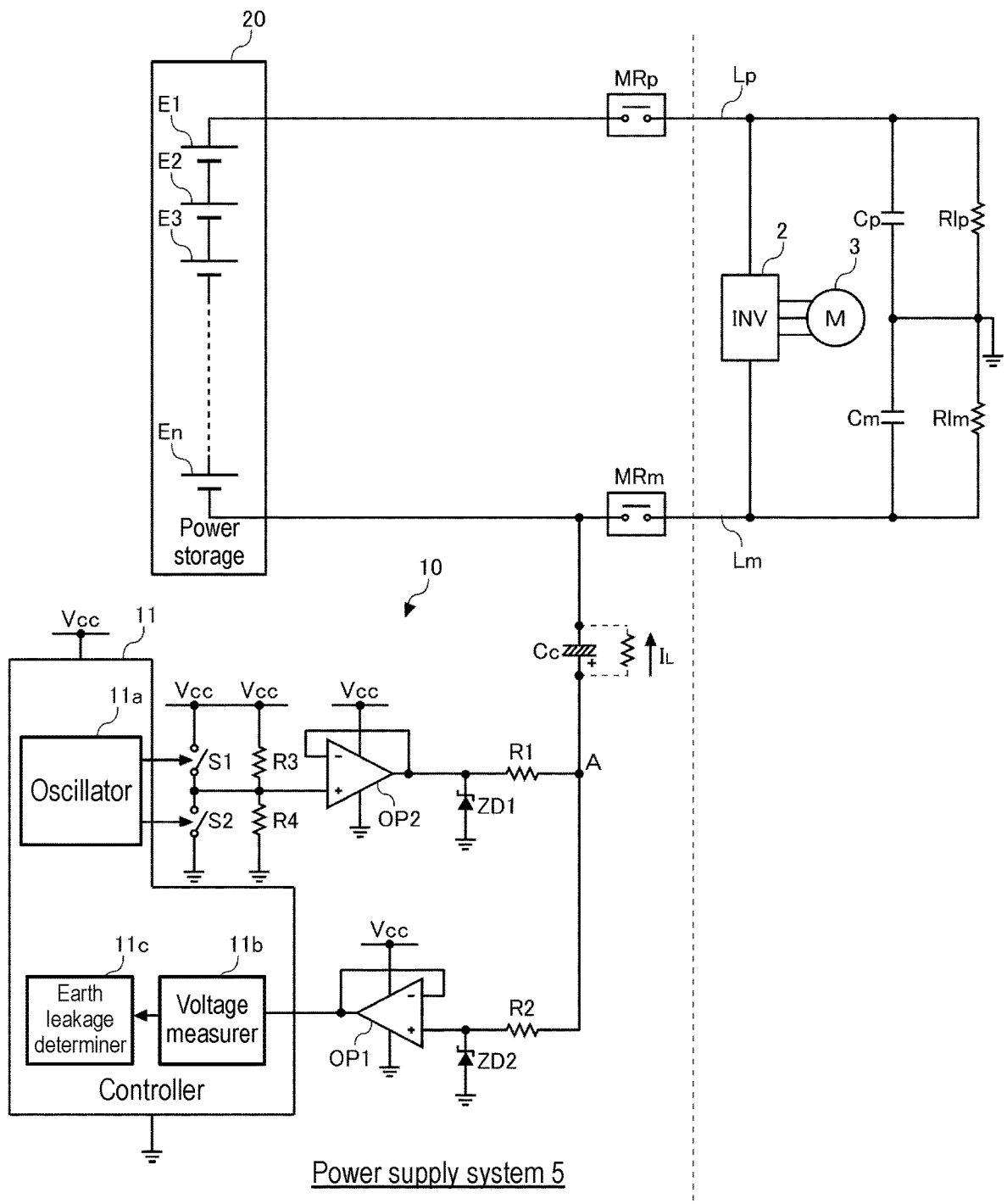
FIG. 7 is a diagram illustrating a state in which a leakage current is flowing through a coupling capacitor in the power supply system including the earth leakage detecting device according to the first exemplary embodiment.

FIG. 7 is a diagram illustrating a state in which leakage current $I_L$ is flowing through coupling capacitor Cc in power supply system 5 including earth leakage detecting device 10 according to the first exemplary embodiment. When an aluminum electrolytic capacitor is used as coupling capacitor Cc, leakage current $I_L$ easily flows. Leakage current $I_L$ of the aluminum electrolytic capacitor has a property of increasing when a state of no load continues for a long time or when temperature rises.

Figure 8:
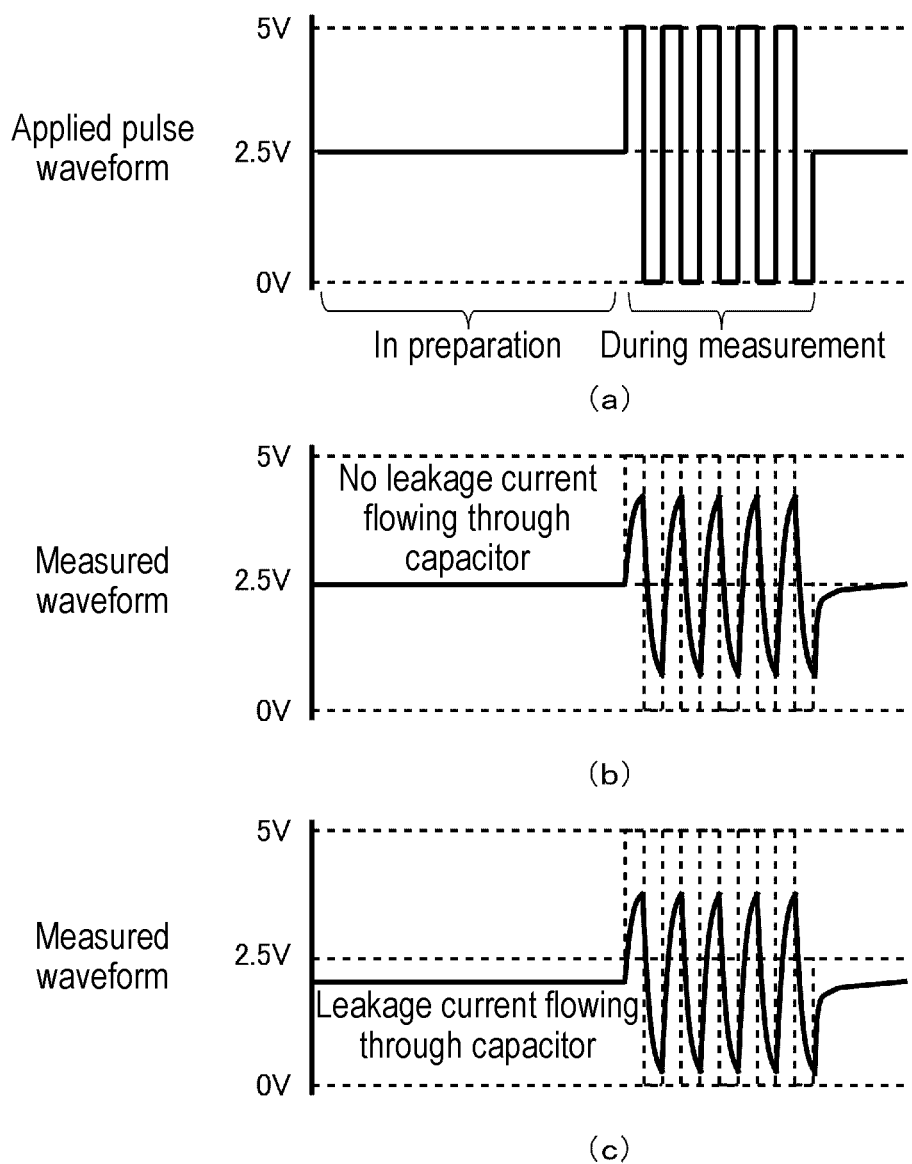
FIGS. 8(a) to 8(c) is diagram for describing an influence of the leakage current of the coupling capacitor on the earth leakage determination in the first exemplary embodiment.

FIGS. 8(a) to 8(c) is diagram for describing an influence of leakage current $I_L$ of coupling capacitor Cc on the earth leakage determination in the first exemplary embodiment. FIG. 8(b) illustrates a voltage waveform at measurement point A in an ideal state where leakage current $I_L$ is not flowing through coupling capacitor Cc, and FIG. 8(c) illustrates a voltage waveform at measurement point A in a state where leakage current $I_L$ is flowing through coupling capacitor Cc. When leakage current $I_L$ flows through coupling capacitor Cc, a charging current flows from the voltage output unit to coupling capacitor Cc via first resistor R1. When the current flows through first resistor R1, the voltage at measurement point A decreases due to a voltage drop, and the measured voltage waveform as a whole decreases as illustrated in FIG. 8(c).

Earth leakage determiner 11c sets a constant voltage measured in the preparation period in which the intermediate potential (2.5 V) is applied to measurement point A, to reference potential Vb. The constant voltage to be measured becomes a value lower than the intermediate potential (2.5 V), and reference potential V is set to a value lower than the intermediate potential (2.5 V). However, since the measured voltage waveform as a whole decreases, the first peak value defined by the difference between upper peak value Vp1 and reference potential Vb and the second peak value defined by the difference between reference potential Vb and lower peak Vp2 are the same values in FIGS. 8(b) and 8(c). Therefore, in the first exemplary embodiment, the presence or absence of an earth leakage between the current path of power storage 20 and the chassis ground can be determined without being affected by leakage current $I_L$ of coupling capacitor Cc.

When main relays MRp, MRm are turned on, the voltage of power storage 20 greatly fluctuates, and accordingly, a charging current flows from the voltage output unit to coupling capacitor Cc via first resistor R1. In this case, the voltage at measurement point A greatly decreases and greatly deviates below an input voltage range (from 0 V to 5 V, inclusive) of first operational amplifier OP1 that defines a measurement range of voltage measurer 11b. The voltage at measurement point A returns to the intermediate potential (2.5 V) as the charging current of coupling capacitor Cc decreases, and returns to the intermediate potential (2.5 V) at a time point when the charging of coupling capacitor Cc is completed. When earth leakage resistance Rlp is large, it may take 30 seconds or more for the voltage waveform as a whole at measurement point A to enter the measurement range (from 0 V to 5 V, inclusive).

Figure 9:
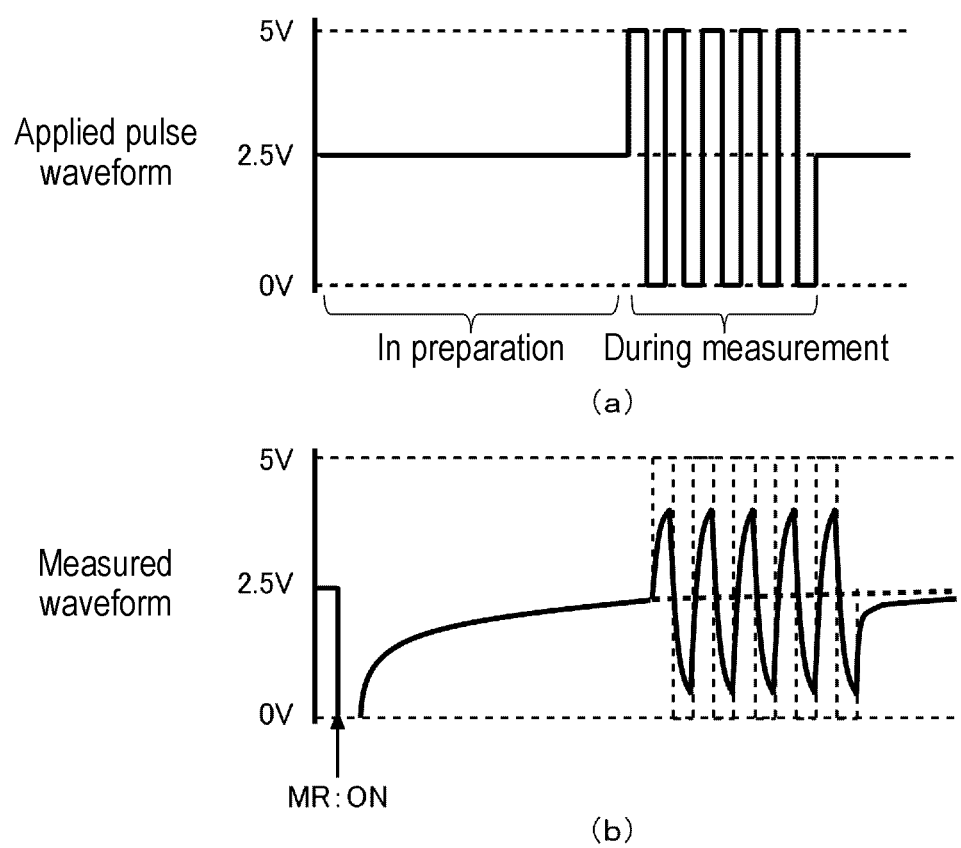

FIGS. 9(a) and 9(b) are diagrams illustrating an example of the measured voltage waveform when main relays MRp, MRm are turned on. For example, when the voltage of power storage 20 is 250 V, main relays MRp, MRm are turned on, and then the voltage at measurement point A decreases to around −250 V. Note that voltage measurer 11b recognizes that a measured voltage is fixed at a lower limit (0 V).

In the first exemplary embodiment, the voltage output unit outputs the intermediate potential (2.5 V) before a center potential of the measured voltage returns to the intermediate potential (2.5 V) of the measurement range. When a constant potential within the measurement range (excluding a potential fixed at an upper limit or the lower limit of the measurement range) can be detected from the measured voltage, earth leakage determiner 11c sets the detected potential to reference potential Vb. The voltage output unit outputs the pulse voltage from a time point when earth leakage determiner 11c sets reference potential Vb. Earth leakage determiner 11c calculates the first peak value on the basis of upper peak value Vp1 of the measured voltage waveform and reference potential Vb, and determines the presence or absence of an earth leakage on the basis of the calculated first peak value.

Note that the voltage at measurement point A is deviated above the measurement range in some cases. When main relays MRp, MRm are turned on or off in a state where coupling capacitor Cc is charged for some reason, a discharge current flows from coupling capacitor Cc toward the voltage output unit via first resistor R1. In this case, the voltage at measurement point A greatly increases and greatly deviates above the measurement range.

Still in this case, in the first exemplary embodiment, the voltage output unit outputs the intermediate potential (2.5 V) before the center potential of the measured voltage returns to the intermediate potential (2.5 V) of the measurement range. When a constant potential within the measurement range (excluding an upper limit voltage and a lower limit voltage of the measurement range) can be detected from the measured voltage, earth leakage determiner 11c sets the detected potential to reference potential Vb. The voltage output unit outputs the pulse voltage from a time point when earth leakage determiner 11c sets reference potential Vb. Earth leakage determiner 11c calculates a second peak value on the basis of lower peak value Vp2 of the measured voltage and reference potential Vb, and determines the presence or absence of an earth leakage on the basis of the calculated second peak value.

As described above, in the first exemplary embodiment, when the voltage at measurement point A greatly deviates from the measurement range, the earth leakage determination can be started at a stage before the center potential of a measured potential returns to the intermediate potential of the measurement range. This can shorten a period during which the earth leakage determination cannot be made.

Second Exemplary Embodiment

Figure 10:
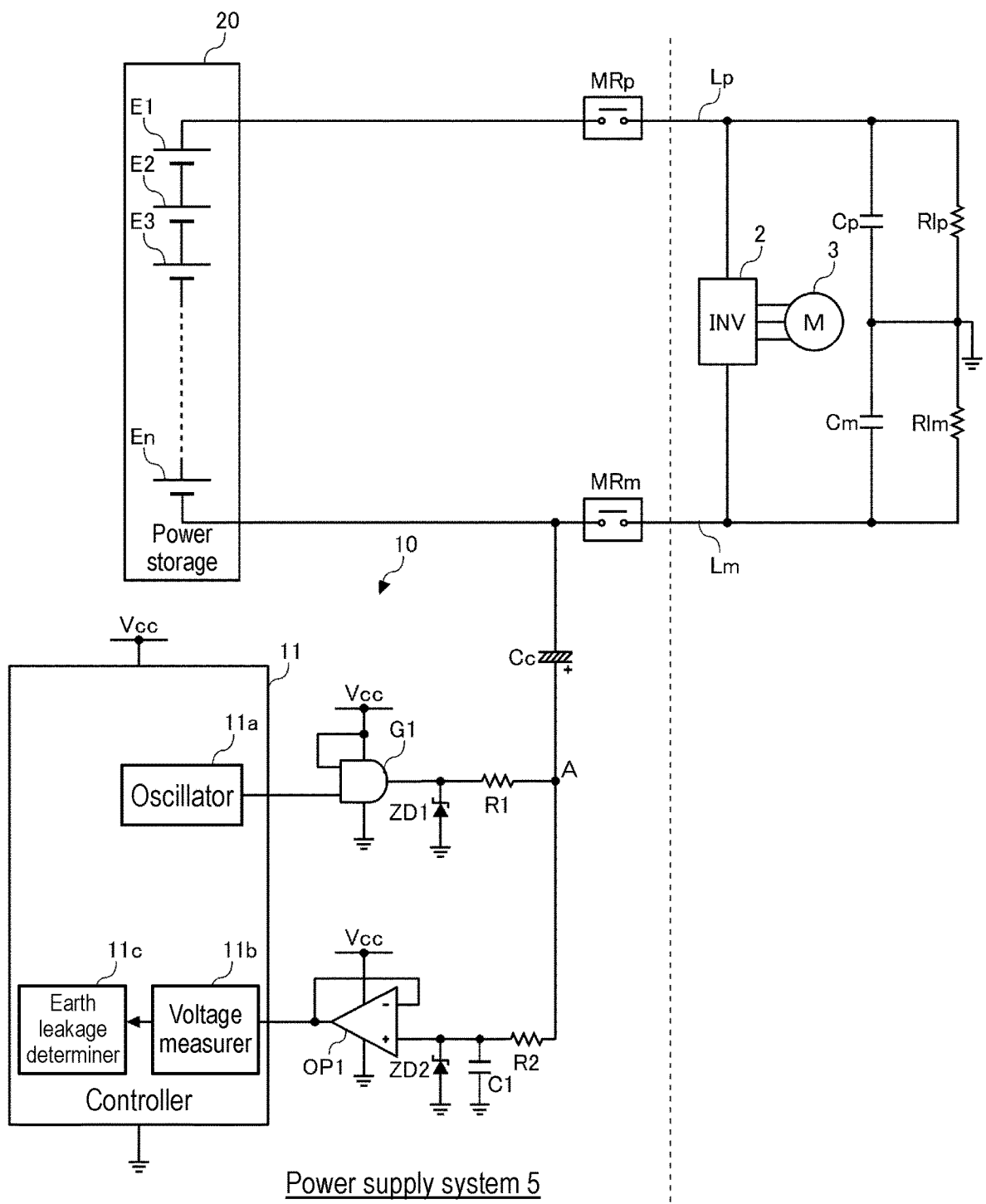
FIG. 10 is a diagram for describing a configuration of a power supply system including an earth leakage detecting device according to a second exemplary embodiment.

FIG. 10 is a diagram for describing a configuration of power supply system 5 including earth leakage detecting device 10 according to a second exemplary embodiment. In the second exemplary embodiment, instead of applying the intermediate potential to measurement point A in the preparation period, a high-frequency rectangular wave voltage is applied.

In the second exemplary embodiment, smoothing capacitor C1 is connected between the chassis ground and the connection point between second resistor R2 and the non-inverting input terminal of first operational amplifier OP1. Second resistor R2 and smoothing capacitor C1 constitute a low-pass filter. A constant of the low-pass filter is designed to a value capable of removing at least high frequency noise mixed from the vehicle.

In the second exemplary embodiment, since it is not necessary to output the intermediate potential from the voltage output unit, the voltage output unit can adopt the configuration of the voltage output unit according to the comparative example illustrated in FIG. 1. That is, third resistor R3, fourth resistor R4, first switch S1, and second switch S2 can be omitted.

The voltage output unit outputs a rectangular wave voltage having a frequency passing through the low-pass filter in the measurement period. The voltage output unit outputs a high-frequency rectangular wave voltage converted into a constant voltage by the low-pass filter in the preparation period before the measurement period. For example, a frequency of the rectangular wave voltage output in the preparation period may be set to 100 times or more the frequency of the rectangular wave voltage output in the measurement period. A relationship between the frequency of the rectangular wave voltage output in the measurement period and the frequency of the rectangular wave voltage output in the preparation period largely depends on the constant of the low-pass filter. For example, the frequency of the rectangular wave voltage output in the measurement period may be set to about 2 Hz, and the frequency of the rectangular wave voltage output in the preparation period may be set to 250 Hz to 500 Hz, inclusive.

Figure 11:
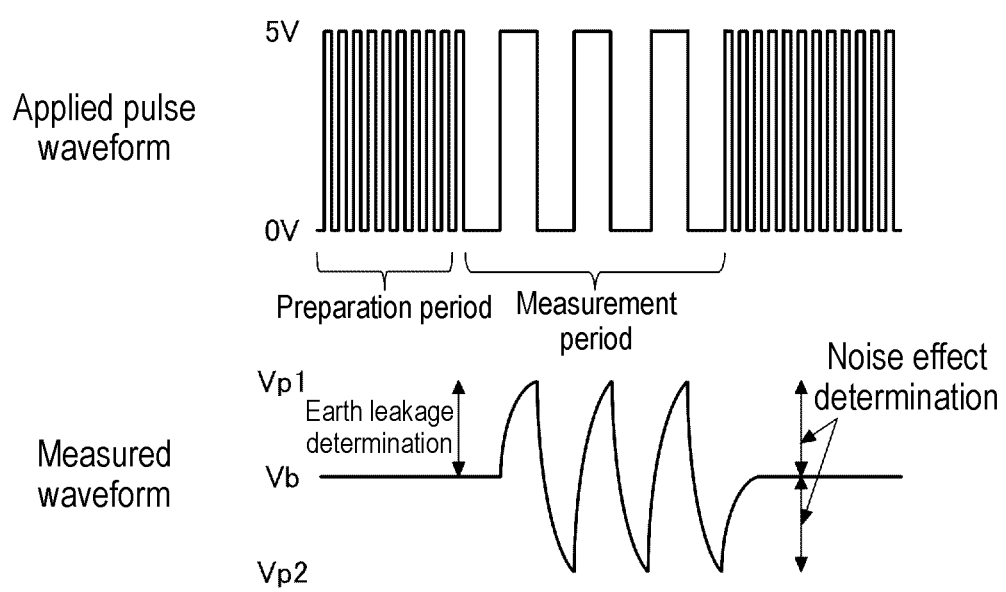
FIG. 11 is a diagram illustrating an example of an applied pulse waveform and a measured voltage waveform in the second exemplary embodiment.

FIG. 11 is a diagram illustrating an example of an applied pulse waveform and a measured voltage waveform in the second exemplary embodiment. In the second exemplary embodiment, the voltage output unit outputs a high-frequency pulse voltage in the preparation period. Earth leakage determiner 11c sets the voltage measured in the preparation period to reference potential Vb. The voltage output unit outputs a pulse voltage for measurement in the measurement period. Voltage measurer 11b specifies upper peak value Vp1 and lower peak value Vp2 of the voltage waveform measured in the measurement period. Earth leakage determiner 11c determines the presence or absence of an earth leakage on the basis of a first peak value defined by a difference between upper peak value Vp1 and reference potential Vb. Earth leakage determiner 11c may determine the presence or absence of an earth leakage on the basis of the second peak value defined by a difference between reference potential Vb and lower peak Vp2. Similarly to the first exemplary embodiment, earth leakage determiner 11c can compare the first peak value with the second peak value to evaluate the reliability of the earth leakage determination.

As described above, the second exemplary embodiment provides a similar effect to the first exemplary embodiment. Furthermore, in the second exemplary embodiment, since the voltage output unit does not need to output the intermediate potential, the configuration of the voltage output unit can be simplified.

The present disclosure is described above according to the exemplary embodiments. It will be understood by the person of ordinary skill in the art that the exemplary embodiments are merely an example, other modified examples in which configuration elements and processing processes of the exemplary embodiments are variously combined are possible, and the other exemplary modifications still fall within the scope of the present disclosure.

In the first exemplary embodiment, an example has been described in which third resistor R3 and fourth resistor R4 having the same value are used, and the voltage output unit outputs the intermediate potential in the preparation period. In this regard, a voltage division ratio between third resistor R3 and fourth resistor R4 is not necessarily set to 1:1. For example, the ratio may be set to 4:1. In this case, the voltage output unit outputs a potential of one fifth of the voltage between the high-side potential and the low-side potential of the rectangular wave voltage in the preparation period. When the voltage between the high-side potential and the low-side potential of the rectangular wave voltage is 5 V, the voltage output unit outputs a constant potential of 1 V in the preparation period. Earth leakage determiner 11c validates the earth leakage determination when the first peak value and the second peak value are 4:1, and invalidates the earth leakage determination when the ratio is other than 4:1.

In the first and second exemplary embodiments, earth leakage determiner 11c compares the first peak value with the second peak value to evaluate the reliability of the earth leakage determination, and compares the first peak value or the second peak value with the set value to determine the presence or absence of an earth leakage. In this regard, earth leakage determiner 11c may compare the first peak value with the second peak value to evaluate the reliability of the earth leakage determination, and compare the peak-to-peak value defined by the difference between upper peak value Vp1 and lower peak value Vp2 with the set value for the peak-to-peak value to determine the presence or absence of the earth leakage.

In the first and second exemplary embodiments, an example has been described in which the rectangular wave voltage is applied from the voltage output unit to coupling capacitor Cc via first resistor R1. In this respect, a sinusoidal signal voltage may be applied to coupling capacitor Cc. Still in this case, earth leakage determiner 11c can specify the reference potential, the upper peak value, and the lower peak value from the voltage at measurement point A, and determine the presence or absence of an earth leakage as in the first and second exemplary embodiments.

In the first and second exemplary embodiments, an example has been described in which earth leakage detecting device 10 is mounted on an electric powered vehicle and used. In this regard, earth leakage detecting device 10 according to the first and second exemplary embodiments can also be applied for other than in-vehicle use. The load may be any load as long as power storage 20 and the load that receives power supply from power storage 20 are insulated from the ground. For example, the load may be a load used in a railway vehicle.

Note that the exemplary embodiments may be specified by the following items.

[Item 1]

Earth leakage detecting device (10) includes coupling capacitor (Cc) including a first end that is connected to a current path of power storage (20) connected to load (2) in a state of being insulated from a ground, voltage output unit (11a, S1, S2, R3, R4, OP2) that generates a periodic voltage that changes periodically, voltage output unit (11a, S1, S2, R3, R4, OP2) applying the periodic voltage to a second end of coupling capacitor (Cc) via impedance element (R1), voltage measurer (11b) that measures a voltage at a connection point between coupling capacitor (Cc) and impedance element (R1), and earth leakage determiner (11c) that determines presence or absence of an earth leakage between the current path of power storage (20) and the ground based on the voltage measured by voltage measurer (11b), in which voltage output unit (11a, S1, S2, R3, R4, OP2) is provided with a preparation period in which a potential between a high-side potential and a low-side potential of the periodic voltage is constantly output before a measurement period in which the periodic voltage is output, earth leakage determiner (11c) sets a voltage measured in the preparation period to a reference potential, and earth leakage determiner (11c) uses, for earth leakage determination in the current path of power storage (20), at least one of a first peak value indicated by a difference between an upper peak value of a voltage waveform measured in the measurement period and the reference potential or a second peak value indicated by a difference between the reference potential and a lower peak value of the voltage waveform measured in the measurement period.

This can achieve the earth leakage detection with high detection accuracy with a simple configuration.

[Item 2]

In earth leakage detecting device (10) according to item 1, earth leakage determiner (11c) compares the first peak value with the second peak value and evaluates reliability of the earth leakage determination.

Thus, an influence of noise can be confirmed.

[Item 3]

In earth leakage detecting device (10) according to item 2, voltage output unit (11a, S1, S2, R3, R4, OP2) constantly outputs an intermediate potential of the periodic voltage in the preparation period, and earth leakage determiner (11c) invalidates the earth leakage determination when the first peak value and the second peak value do not correspond to each other.

Thus, determination accuracy can be improved by invalidating the earth leakage determination greatly affected by noise.

[Item 4]

In earth leakage detecting device (10) according to any one of items 1 to 3, earth leakage determiner (11c) determines that an earth leakage has occurred between the ground and the current path of power storage (20) when the first peak value is smaller than a first set value, when the second peak value is smaller than a second set value, or when a peak-to-peak value indicated by a difference between the upper peak value and the lower peak value is smaller than a third set value.

This configuration enables determination of presence or absence of an earth leakage with high accuracy.

[Item 5]

In earth leakage detecting device (10) according to any one of items 1 to 4, voltage output unit (11a, S1, S2, R3, R4, OP2) suspends a transition to the measurement period when voltage measurer (11b) does not measure a constant potential for a predetermined time or more in the preparation period.

This makes it possible to confirm the influence of noise in advance and suspend the earth leakage determination when the influence of noise is great.

[Item 6]

Earth leakage detecting device (10) includes coupling capacitor (Cc) including a first end that is connected to a current path of power storage (20) connected to load (2) in a state of being insulated from a ground, voltage output unit (11a, G1) that generates a periodic voltage that periodically changes, voltage output unit (11a, G1) applying the periodic voltage to a second end of coupling capacitor (Cc) via impedance element (R1), voltage measurer (11b) that measures a voltage at a connection point between coupling capacitor (Cc) and impedance element (R1) via a low-pass filter, and earth leakage determiner (11c) that determines presence or absence of an earth leakage between the current path of power storage (20) and the ground based on the voltage measured by voltage measurer (11b), in which voltage output unit (11a, G1) is provided with a preparation period for outputting a high-frequency periodic voltage converted to a constant voltage by the low-pass filter before a measurement period for outputting the periodic voltage of a frequency passing through the low-pass filter, earth leakage determiner (11c) sets a voltage measured in the preparation period to a reference potential, and earth leakage determiner (11c) uses, for earth leakage determination in the current path of power storage (20), at least one of a first peak value indicated by a difference between an upper peak value of a voltage waveform measured in the measurement period and the reference potential or a second peak value indicated by a difference between the reference potential and a lower peak value of the voltage waveform measured in the measurement period.

This can achieve the earth leakage detection with high detection accuracy with a simple configuration. This eliminates a need for a configuration for generating the intermediate potential of the periodic voltage.

[Item 7]

Vehicular power supply system (5) includes power storage (20) that is mounted in a state of being insulated from a chassis ground of a vehicle and supplies power to load (2) in the vehicle, and earth leakage detecting device (10) described in any one of items 1 to 6.

This can achieve vehicular power supply system (5) including earth leakage detecting device (10) having a simple configuration with high detection accuracy.

REFERENCE MARKS IN THE DRAWINGS

2: inverter
3: motor
Lp: positive wire
Lm: negative wire
Cp: positive-side Y capacitor
Cm: negative-side Y capacitor
C1: smoothing capacitor
R1p: positive-side earth leakage resistance
R1m: negative-side earth leakage resistance
5: power supply system
20: power storage
E1 to En: cell
10: earth leakage detecting device
11: controller
11a: oscillator
11b: voltage measurer
11c: earth leakage determiner
Cc: coupling capacitor
R1: first resistor
R2: second resistor
R3: third resistor
R4: fourth resistor
OP1: first operational amplifier
OP2: second operational amplifier
G1: AND gate
ZD1: first zener diode
ZD2: second zener diode
S1: first switch
S2: second switch

The invention claimed is:

1. An earth leakage detecting device comprising:
a coupling capacitor including a first end that is connected to a current path of a power storage, the power storage being connected to a load and insulated from a ground;
a voltage output unit that generates a periodic voltage that changes periodically, the voltage output unit applying the periodic voltage to a second end of the coupling capacitor via an impedance element;
a voltage measurer that measures a voltage at a connection point between the coupling capacitor and the impedance element; and
an earth leakage determiner that makes determination whether or not an earth leakage has occurred based on the voltage measured by the voltage measurer between the current path of the power storage and the ground, wherein
the voltage output unit is provided with (i) a preparation period in which the voltage output unit constantly outputs a potential between a high-side potential and a low-side potential of the periodic voltage, and (ii) a measurement period in which the voltage output unit outputs the periodic voltage, the preparation period being prior to the measurement period,
the earth leakage determiner sets a voltage measured in the preparation period to a reference potential, and
the earth leakage determiner uses at least one of a first peak value or a second peak value in the determination made by the power storage, the first peak value being indicated by a difference between an upper peak value of a voltage waveform measured in the measurement period and the reference potential, the second peak value being indicated by a difference between the reference potential and a lower peak value of the voltage waveform measured in the measurement period.

2. The earth leakage detecting device according to claim 1, wherein the earth leakage determiner compares the first peak value with the second peak value to evaluate a reliability of the determination.

3. The earth leakage detecting device according to claim 2, wherein
the voltage output unit constantly outputs an intermediate potential of the periodic voltage in the preparation period, and
the earth leakage determiner invalidates the determination when the first peak value and the second peak value do not correspond to each other.

4. The earth leakage detecting device according to claim 1, wherein the earth leakage determiner determines that an earth leakage has occurred between the ground and the current path of the power storage when the first peak value is smaller than a first set value, when the second peak value is smaller than a second set value, or when a peak-to-peak value indicated by a difference between the upper peak value and the lower peak value is smaller than a third set value.

5. The earth leakage detecting device according to claim 1, wherein the voltage output unit suspends a transition to the measurement period when the voltage measurer does not measure a constant potential for a predetermined time or more in the preparation period.

6. A vehicular power supply system comprising:
the earth leakage detecting device described in claim 1; and
the power storage that is mounted in the state of being insulated from the chassis ground of the vehicle and supplies power to the load in the vehicle.

7. An earth leakage detecting device comprising:
a coupling capacitor including a first end that is connected to a current path of a power storage, the power storage being connected to a load and insulated from a ground;
a voltage output unit that generates a periodic voltage that changes periodically, the voltage output unit applying the periodic voltage to a second end of the coupling capacitor via an impedance element;
a voltage measurer that measures a voltage at a connection point between the coupling capacitor and the impedance element via a low-pass filter; and
an earth leakage determiner that makes determination whether or not an earth leakage has occurred based on the voltage measured by the voltage measurer between the current path of the power storage and the ground, wherein
the voltage output unit is provided with (i) a preparation period for outputting a high-frequency periodic voltage converted to a constant voltage by the low-pass filter, and (ii) a measurement period for outputting the periodic voltage of a frequency passing through the low-pass filter, the preparation period being prior to the measurement period, the earth leakage determiner sets a voltage measured in the preparation period to a reference potential, and the earth leakage determiner uses at least one of a first peak value or a second peak value in the determination made by the power storage, the first peak value being indicated by a difference between an upper peak value of a voltage waveform measured in the measurement period and the reference potential, the second peak value being indicated by a difference between the reference potential and a lower peak value of the voltage waveform measured in the measurement period.

* * * * *